United States Patent
Muccini et al.

(10) Patent No.: US 10,615,233 B2
(45) Date of Patent: Apr. 7, 2020

(54) DISPLAY CONTAINING IMPROVED PIXEL ARCHITECTURES

(71) Applicant: Flexterra, Inc., Skokie, IL (US)

(72) Inventors: Michele Muccini, Bologna (IT); Gianluca Generali, Bologna (IT); Ricardo D'Alpaos, Auronzo di Cadore (IT); Antonio Facchetti, Chicago, IL (US); Chung-Chin Hsiao, Zhubei (TW); Hugh Lien, Toufen Township (TW)

(73) Assignee: Flexterra, Inc., Skokie, IL (US)

( * ) Notice: Subject to any disclaimer, the term of this patent is extended or adjusted under 35 U.S.C. 154(b) by 0 days.

(21) Appl. No.: 15/594,550

(22) Filed: May 12, 2017

(65) Prior Publication Data

US 2017/0250238 A1      Aug. 31, 2017

Related U.S. Application Data

(63) Continuation of application No. PCT/US2015/060542, filed on Nov. 13, 2015.

(60) Provisional application No. 62/079,709, filed on Nov. 14, 2014.

(30) Foreign Application Priority Data

Nov. 14, 2014    (EP) .................................... 14425146

(51) Int. Cl.
*H01L 27/32* (2006.01)
*H01L 51/52* (2006.01)

(52) U.S. Cl.
CPC ...... *H01L 27/3262* (2013.01); *H01L 27/3274* (2013.01); *H01L 51/5271* (2013.01); *H01L 51/5296* (2013.01)

(58) Field of Classification Search
None
See application file for complete search history.

(56) References Cited

U.S. PATENT DOCUMENTS

| | | | |
|---|---|---|---|
| 8,497,501 B2 | 7/2013 | Muccini et al. | |
| 8,664,648 B2 | 3/2014 | Hwang et al. | |
| 8,758,649 B2 | 6/2014 | James et al. | |
| 2006/0208962 A1 | 9/2006 | Sekiya | |
| 2007/0187674 A1 | 8/2007 | Nakamura | |
| 2008/0142789 A1 | 6/2008 | Suganuma | |
| 2008/0179598 A1 | 7/2008 | Kim | |

(Continued)

FOREIGN PATENT DOCUMENTS

| CN | 1905207 A | 1/2007 |
|---|---|---|
| CN | 1910962 A | 2/2007 |

(Continued)

OTHER PUBLICATIONS

Nakamura, Kenji et al., "Metal-Insulator-Semiconductor-Type Organic Light-Emitting Transistor on Plastic Substrate," Appl. Phys. Lett. 89, 103525 (2006), 4 pages.

(Continued)

*Primary Examiner* — Daniel Whalen
(74) *Attorney, Agent, or Firm* — McDonnell Boehnen Hulbert & Berghoff LLP (57) ABSTRACT

The invention relates to improved Organic Light Emitting Transistor (OLET) pixel architecture for OLET based displays.

21 Claims, 9 Drawing Sheets

(56) References Cited

U.S. PATENT DOCUMENTS

| | | | |
|---|---|---|---|
| 2010/0090202 A1* | 4/2010 | Obata | ................ H01L 51/002 257/40 |
| 2012/0248633 A1 | 10/2012 | Fukuda | |
| 2013/0240842 A1 | 9/2013 | Rinzler et al. | |
| 2014/0054566 A1* | 2/2014 | Facchetti | ........... H01L 51/5203 257/40 |
| 2014/0117317 A1 | 5/2014 | Kim | |
| 2014/0299852 A1 | 10/2014 | Hong | |
| 2016/0049603 A1 | 2/2016 | Kleemann | |

FOREIGN PATENT DOCUMENTS

| | | |
|---|---|---|
| CN | 101040391 A | 9/2007 |
| CN | 101069298 A | 11/2007 |
| CN | 103219463 A | 7/2013 |
| CN | 103500752 A | 1/2014 |
| CN | 103794724 A | 5/2014 |
| CN | 104094436 A | 10/2014 |
| EP | 1 718 126 A1 | 11/2006 |
| EP | 1 748 680 A2 | 1/2007 |
| EP | 2 574 219 | 4/2013 |
| EP | 2 583 329 | 4/2013 |
| EP | 2 737 559 | 6/2014 |
| GB | 2 433 161 A | 6/2007 |
| JP | 2006-252774 A | 9/2006 |
| JP | 2010-80467 A | 4/2010 |
| JP | 2010-275239 A | 10/2010 |
| WO | WO 2007/043696 A1 | 4/2007 |
| WO | WO 2010/049871 A2 | 5/2010 |
| WO | WO 2011/147523 A1 | 12/2011 |
| WO | 2012165612 A1 | 12/2012 |
| WO | WO 2013/017999 A1 | 2/2013 |
| WO | WO 2013/018000 A1 | 2/2013 |
| WO | WO 2013/018002 A1 | 2/2013 |
| WO | 2013122198 A1 | 8/2013 |
| WO | WO 2013/128344 A1 | 9/2013 |

OTHER PUBLICATIONS

Capellli, Raffaella et al., "Organic Light-Emitting Transistors With an Efficiency That Outperforms the Equivalent Light-Emitting Diodes," Nature Materials, vol. 9, No. 6, dated Jun. 1, 2010, pp. 496-503.

International Search Report issued in co-pending PCT/US2015/060542, European Patent Office, dated Feb. 18, 2016, 4 pages.

International Preliminary Report on Patentability issued in co-pending PCT/US2015/060542, International Bureau of WIPO, dated May 16, 2017, 8 pages.

* cited by examiner

DISPLAY CONTAINING IMPROVED PIXEL ARCHITECTURES

CROSS-REFERENCE TO RELATED APPLICATIONS

This is a continuation of International Application No. PCT/US2015/060542 filed on Nov. 13, 2015, which claims priority to and the benefit of the filing dates of U.S. Provisional Patent Application Ser. No. 62/079,709 filed on Nov. 14, 2014, and European Patent Application Ser. No. 14425146.9 filed on Nov. 14, 2014, the entire disclosure of each of which is incorporated by reference herein for all purposes.

FIELD

The present invention relates to improved pixel architectures for displays based on organic light emitting transistors (OLETs).

BACKGROUND

OLETs are a recent type of light emitting devices that is attracting increasing attention compared to other devices such as organic light emitting diodes (OLEDs) due to their ease of manufacturing, high brightness and other improved features. See Muccini at al, "Organic light-emitting transistors with an efficiency that outperforms the equivalent light-emitting diodes," *Nature Materials*, 9: 496-503 (2010).

More information on the relevant development of OLET structures may also be found in U.S. Pat. No. 8,497,501, European Patent Publication No. 2737559, European Patent Publication No. 2574219, European Patent Publication No. 2583329, and European Patent Publication No. 2786437.

All the above-identified patent documents are related to OLET structures, i.e., the light emitting devices, but not to specific architectures and solutions for making display pixels.

U.S. Patent Publication No. 2013/0240842 describes a certain pixel architecture for OLET-based displays. More specifically, the described architecture includes a vertical organic field effect transistor (VFET) coupled to a vertical organic light emitting transistor (VOLET), where the VFET functions as a switching transistor and where the VOLET functions as a driving transistor that is also configured to emit light in response to activation by the switching transistor. Because organic semiconductors generally have low output currents compared to silicon semiconductors, one way to achieve high output current using organic semiconductors is to shorten the channel length. In the conventional lateral channel thin film transistor design (in which the source and drain electrodes are laterally displaced from each other), shortening the channel length involves placing the source and drain electrodes very close to each other which can be expensive due to the need for high resolution patterning. In a vertical field effect transistor (in which the source and drain electrodes are provided in a vertically overlapping manner), however, the channel length is defined by the thickness of the semiconductor thin film channel layer, which allows submicron channel lengths without using high resolution patterning. Thus, U.S. Patent Publication No. 2013/0240842 attempts to address the shortcomings of lateral channel thin film transistors by using a VFET as the switching transistor for an OLET instead.

SUMMARY

The purpose of the present invention is to provide a new pixel architecture for an OLET-based display, where each pixel includes an OLET and a lateral channel field-effect transistor that can be either a switching or a driving transistor for the OLET. In particular, the inventors have found that specific configuration choices in the relative positioning of and connections between the source, drain, and gate electrodes in the OLET can provide distinctive advantages and optimized performances even when coupled with a lateral channel field effect transistor as the switching or driving transistor.

Accordingly, in a first aspect, the present invention relates to a display containing an array of pixels, wherein each pixel comprises at least a first transistor (100) and at least a second transistor (200) mounted on a common substrate (11). The first transistor in the display pixel can function as either a switching transistor or a driving transistor for the second transistor, which is a light emitting transistor. As used herein, the first transistor may be referred herein as either the first driving transistor or the first switching transistor, and the second transistor may be referred herein as the second light emitting transistor. In the context and for the purposes of the present invention, the terms "first driving transistor" and "first switching transistor" are to be understood as interchangeable as they indicate the capability of the first transistor to control and command the voltage supplied to the second light emitting transistor.

Further, elements of the same nature that are present in both transistors are referred as a first element of a particular nature if present in the first transistor (e.g., a first dielectric layer) and a second element of that same nature if present in the second transistor (e.g., a second dielectric layer).

In the present display pixel, the first driving transistor (100) comprises the following elements:
- a first source electrode and a first drain electrode (12, 12') physically separated but electrically connected to each other by a semiconductor layer (13),
- a first dielectric layer (14), and
- at least one first gate electrode (15).

The second light emitting transistor (200) comprises the following elements:
- a second gate electrode (17),
- a second dielectric layer (18),
- a light emitting channel layer (19), and
- a second source electrode having a length Ls and a second drain electrode (20, 20') having a length Ld, wherein the second gate electrode (17) is in electrical contact with at least one of the first source electrode and the first drain electrode (12, 12'), and characterized in that at least one of the second source electrode and the second drain electrode (20, 20') vertically overlaps with the second gate electrode (17) by at least 5 μm, such vertical overlaps being represented by L and L', respectively, and that said second source electrode and second drain electrode are horizontally separated by at least 2 μm.

The expression "vertically overlaps by at least 5 μm" means that the second source electrode and/or the second drain electrode is at least partly vertically aligned with the second gate electrode, that is, Ls and/or Ld at least partially projects into a horizontal space common to the length of the second gate electrode (Lg) albeit on different planes within the vertical stack of the second transistor. Such vertical overlaps L and L' independently can be between 5 μm and 150 μm.

Similarly, the expression "horizontally separated" means that the elements are not vertically aligned and moreover that their projection into a common plane will have a minimal distance (at least 2 μm, and preferably being equal or less than 50 μm).

In certain embodiments, the second source electrode and the second drain electrode can each vertically overlap with different parts of the second gate electrode, where each of such vertical overlaps can be at least 5 µm. In preferred embodiments, the entire length of the second source electrode (Ls) and the entire length of the second drain electrode (Ld), individually, can overlap vertically with different parts of the second gate electrode (in other words, the horizontally separated second source electrode and second drain electrode can be both positioned within the length of the second gate electrode in their respective entireties). Because the second source electrode and the second drain electrode are horizontally separated from each other by a distance that is between 2 µm and 50 µm, in the embodiments where Ls and Ld respectively correspond to L and L', the second gate electrode must have a length that is greater than or at least equal to the sum of Ls, Ld, and the horizontal separation between the second source electrode and the second drain electrode (i.e., the channel length). Accordingly, in these embodiments, Lg can be at least between 12 µm and 350 µm or longer.

In some embodiments, the respective outer edge (i.e., not the edge that defines the channel length) of the second source electrode and the second drain electrode can be aligned with the two edges of the light emitting channel layer. If not aligned, the second source electrode and the second drain electrode can be positioned such that their respective outer edges are close to the two edges of the light emitting channel layer, preferably, the outer edges of the second source electrode and the second drain electrode are horizontally offset from the two edges of the light emitting channel layer (towards the channel length) at a distance that is no more than 20% of the channel length, i.e., the horizontal separation between the second source electrode and the second drain electrode.

A display pixel according to the present invention, therefore, is different from the display pixels described in U.S. Patent Publication No. 2013/0240842 because the light emitting transistor in those pixels has a vertical configuration which requires an almost complete overlap between the source and the drain electrodes, and the direction of charge transport and recombination mechanism is vertical instead of lateral as in the second transistor in the present invention. A vertical light emitting transistor, such as the one described in U.S. Patent Publication No. 2013/0240842, when coupled with a driving TFT for making a display pixel, suffers from the limitations posed by vertical charge transport; specifically, because vertical charge transport occurs across the stack of a plurality of organic layers forming the channel of the light emitting transistor, the charge carrier mobility in such vertical configuration is multiple orders of magnitude lower than that occurring in the plane of the films under the driving force of the lateral field effect.

As mentioned, one of the key features of the pixel architectures according to the present invention is that the OLET in the display pixel includes horizontally separated source and drain electrodes at least one of which vertically overlaps with the gate electrode. This ensures, on one hand, the establishment of a virtual capacity that allows a better and simpler driving of the OLET itself and, on the other hand, the lateral charge transport between the source and the drain electrodes, which allows better electrical device characteristics.

It is important to underline in this regard that the OLET pixel structures (specifically, the second light emitting transistor structures) selected by the inventors are a well-defined subset of OLET structures. Different OLET structures have been reported in the art. For example, U.S. Pat. No. 8,664,648, International Patent Publication No. WO 2011/147523, U.S. Pat. No. 8,758,649, U.S. Patent Publication No. 2014/117317, and International Patent Publication No. WO 2010/049871 describe OLET structures in which there is no vertical overlap between its gate electrode and either of its source and drain electrodes. Similarly, vertical OLETs, such as those described in U.S. Patent Publication No. 2013/0240842, are outside the scope of and are not encompassed by the present invention.

It is also important to underline the importance of useful ranges with regard to the extent of the vertical overlap between the OLET gate electrode and the OLET source and/or drain electrodes as well as the extent of the horizontal separation between the OLET source and drain electrodes, that enable an improved display pixel by coupling such OLET with a TFT by contacting the OLET gate electrode with one of the TFT's source or drain electrodes.

BRIEF DESCRIPTION OF DRAWINGS

The invention will be further described with the help of the following figures where.

In the figures, the dimensions and dimensional ratios of some elements may not be to scale, but in some cases have been altered in order to improve the drawings readability and comprehension such as, for instance, layer thicknesses and source-drain distances and thicknesses. Moreover, just one exemplary top view has been shown, while all other figures are intended to show specific features that are characteristic of particular embodiments, which are more clearly and efficiently illustrated by cross section views.

As used herein, a cross section along line A-A refers to a cross section in the upper part of the display pixel according to the present invention, or, more precisely, to the part of the display pixel showing a first source electrode, a first drain electrode and a first gate electrode of the first driving transistor; while a cross section along line B-B refers to a cross section showing the lower part of the present display pixel, or, more precisely, to the part of the display pixel showing the connection between the second gate electrode of the second light emitting transistor and the first source/drain electrodes of the first driving transistor.

DETAILED DESCRIPTION

Figure 1:
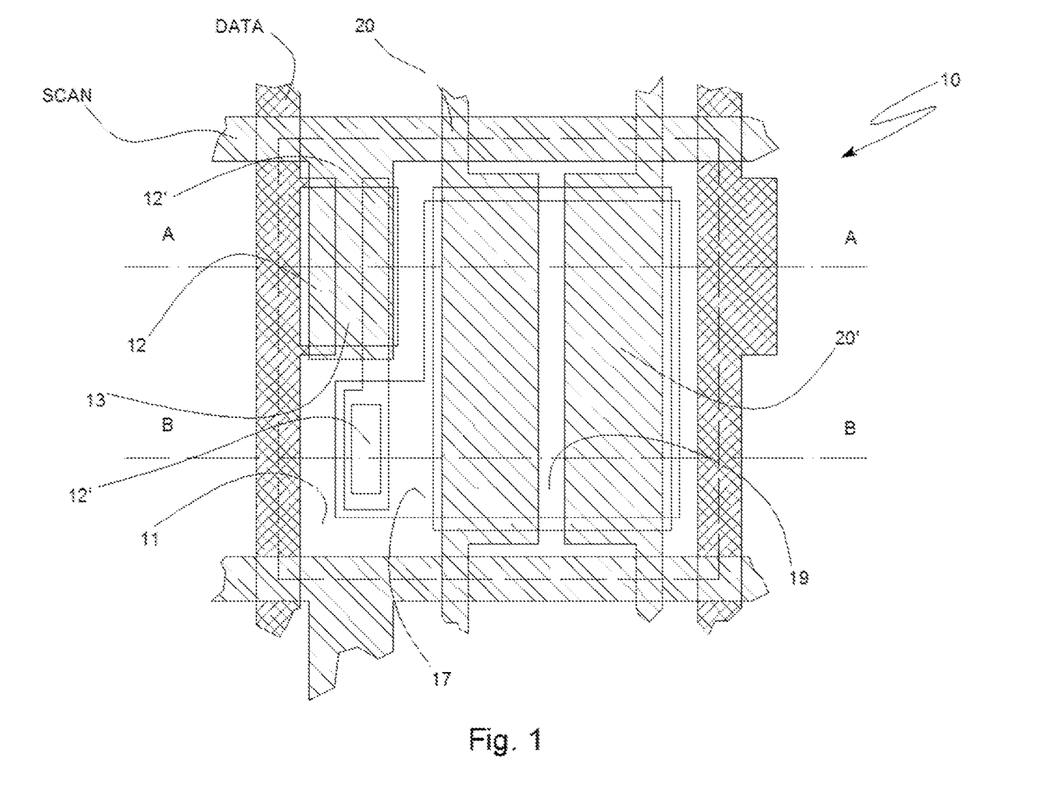
FIG. 1 is a top view of a first preferred embodiment of a display pixel according to the present invention.

FIG. 1 is a top view showing the main components of a display pixel 10 according to the present invention. The display pixel 10 comprises a first transistor, the electrodes of which include the layers 12, 12' and a third electrode (not shown), and a second transistor, that is a light emitting transistor, the electrodes of which are the layers 20, 20' and 17. In the top view illustrated by FIG. 1, it is shown, in particular, a common substrate 11 over which the first (driving) transistor and the second (light emitting) transistor are realized, the first source electrode and the first drain electrode 12 and 12' belonging to the first transistor, the second source electrode and the second drain electrode 20 and 20' belonging to the second transistor, a first gate electrode (not observable from this view) of the first transistor, a second gate electrode 17 of the second transistor, a semiconductor layer 13 electrically coupling the first source electrode and the first drain electrode 12 and 12', and a light emitting channel layer 19 of the second transistor.

Either the first source electrode 12 or the first drain electrode 12' of the first transistor is electrically connected to an address line DATA of the display pixel, and the first gate electrode 15 is electrically connected to an enable line SCAN of the display pixel.

Figure 2A:
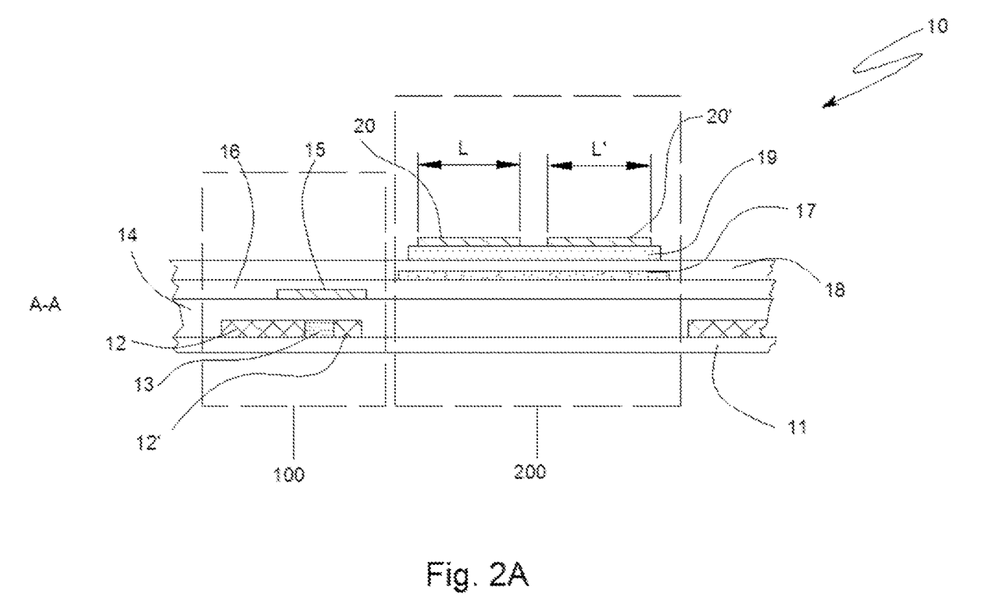
FIG. 2A is a cross section view of the display pixel illustrated in FIG. 1 along line A-A.
Figure 2B:
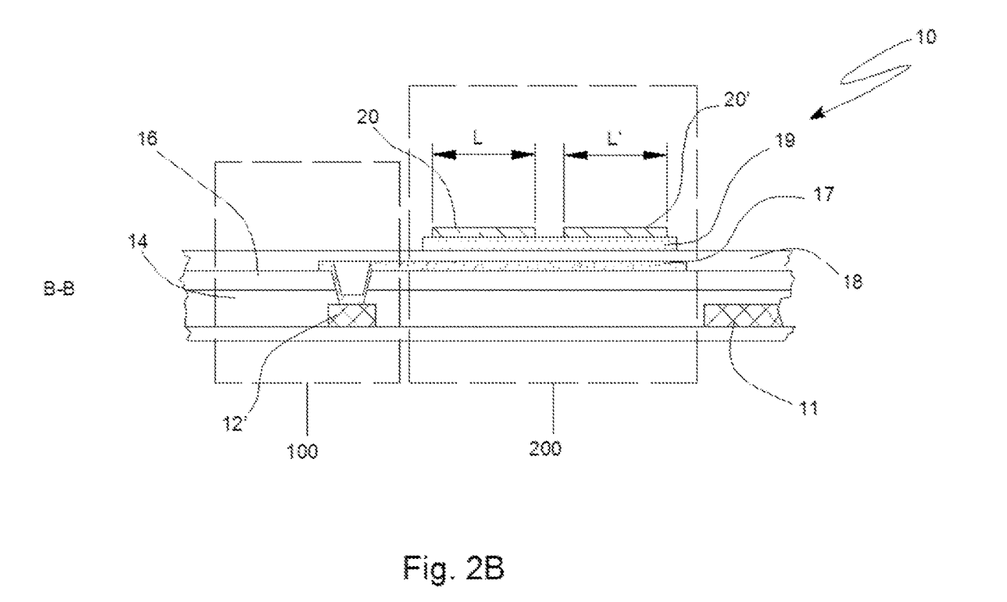
FIG. 2B is a cross section view of the display pixel illustrated in FIG. 1 along line B-B.

As outlined above, the relative positions and connections of these elements with the ones not indicated in FIG. 1 (because they are almost completely overlapped along the illustrated perspective), are instead more clearly observable in the cross section views along lines A-A and B-B.

FIG. 2A shows a cross section view along line A-A of the display pixel 10.

In particular, FIG. 2A shows the vertical structure of the first driving transistor 100 with its constituting elements:
 first source and first drain electrodes 12 and 12',
 semiconductor layer 13,
 first dielectric layer 14, and
 first gate electrode 15,
and the vertical structure of the second light emitting transistor 200 with its constituting elements:
 second gate electrode 17,
 second dielectric layer 18,
 light emitting channel layer 19, and second source and second drain electrodes 20 and 20'. In the cited figure there is also an insulating layer 16 over which the second gate electrode 17 of the second transistor is formed.

The first transistor is functionally coupled with the second transistor so that, when a voltage sufficient to turn on the first transistor is applied at the enable line SCAN, the second light emitting transistor is addressed with the voltage available in that moment at the address line DATA. FIG. 2B shows a cross section view along line B-B of the display pixel 10 and indicates the connection between the first driving transistor 100 and the second light emitting transistor 200, via the second gate electrode 17 which is in electrical contact with element 12 or 12' (first source electrode or first drain electrode).

The display pixel shown in FIGS. 1, 2A and 2B is realized according to a preferred embodiment where the second source electrode and the second drain electrode 20, 20' are horizontally (or laterally) separated (preferably at a distance between at least 2 μm and 50 μm), and the respective entirety of each of the second source electrode and the second drain electrode 20, 20' overlaps vertically with (different parts of) the second gate electrode 17.

However, the invention is not limited to such an embodiment. For example, in certain alternative embodiments, only one of the second source electrode and the second drain electrode needs to overlap vertically with the second gate electrode. In certain embodiments, only a portion (and not the entirety) of the second source electrode and/or the second drain electrode may overlap vertically with the second gate electrode. Generally, the second drain electrode and the second source electrode have dimensions and are arranged such that at least one of them overlaps vertically with the second gate electrode for a length of at least 5 μm. Preferably, such overlapping length is between 5 μm and 150 μm.

Also, FIGS. 1, 2A and 2B show a display pixel in which the light emitting channel layer 19 comprises a single organic semiconductor layer, with the second source and second drain electrodes both positioned on top of the light emitting channel layer 19. In operation, the light emitting channel layer 19 can be unipolar or ambipolar.

With respect to the first transistor, in the embodiment shown in FIGS. 1, 2A and 2B, the semiconductor layer 13 is realized on the same substrate layer 11 on which the first source and first drain electrodes 12, 12' are formed (i.e., the first source and first drain electrodes 12, 12' are co-planar with the semiconductor layer 13), and the first dielectric layer 14 is formed on the substrate 11 over the first source and first drain electrodes 12, 12' and the semiconductor layer 13. The first gate electrode 15 is then formed on top of the first dielectric layer 14 above the semiconductor layer 13. In preferred embodiments, the first gate electrode 15 is dimensioned to overlap the semiconductor layer 13 completely. This is because the semiconductor layer often is composed of an air-sensitive metal oxide or organic compound; accordingly, a top-gate configuration and the use of a large gate electrode would protect the semiconductor layer from air exposure. Nevertheless, it is also possible to fabricate the first transistor in other configurations. For example, an alternative embodiment of the first transistor can have a top-contact bottom-gate architecture, where both the first source electrode 12 and the first drain electrode 12' are formed on top of the semiconductor layer 13 and the first gate electrode 15 is formed below the semiconductor layer 13.

Regardless of the relative arrangements of the electrodes 12, 12' and 15, the first transistor can be encapsulated by one or more additional insulating layers. Referring to FIG. 2A, an overlying insulating layer 16 is formed over the first transistor. More specifically, this insulating layer 16 is deposited on top of the first dielectric layer 14 over the first gate electrode 15 (or in alternative embodiments, not shown, over the first source and first drain electrodes). Referring to FIG. 2B, a via hole is formed through both the insulating layer 16 and the first dielectric layer 14 to provide access to element 12' (the first source electrode or the first drain electrode), and a via is formed by either filling the via hole or lining the sidewalls of the via hole with a conductive material that is in electrical contact with the second gate electrode 17, which is formed on the insulating layer 16. The via, therefore, electrically connects the first transistor 100 and the second transistor 200, by providing electrical contact between element 12' (the first source electrode or the first drain electrode) and the second gate electrode 17. More specifically, the via hole can be V-shaped with non-vertical sidewalls. This helps to assure film continuity when the conductive material is deposited to form the via. The via hole can be generated via photolithography; specifically, with the use of a sequence of masks with increasing apertures.

In an even more preferred embodiment, the length of the second source electrode (Ls) and the length of the second drain electrode (Ld) may fulfill the following relationship:

$$1 \leq \text{Maximum}(Ld,Ls)/\text{Minimum}(Ld,Ls) \leq 25$$

and even more preferably $$1 \leq \text{Maximum}(Ld,Ls)/\text{Minimum}(Ld,Ls) \leq 10$$

It can be observed quite clearly that in the embodiment shown in FIGS. 1, 2A, 2B, the ratio Maximum(Ld,Ls)/Minimum(Ld,Ls) is 1.

Although the embodiment illustrated in FIGS. 1, 2A, 2B is preferred, display pixels according to the present invention are not limited thereto. Other alternative embodiments of the display pixels according to the present invention are shown in FIGS. 3 to 18. The same elements in the various figures are labeled with the same reference numerals.

Figure 3:
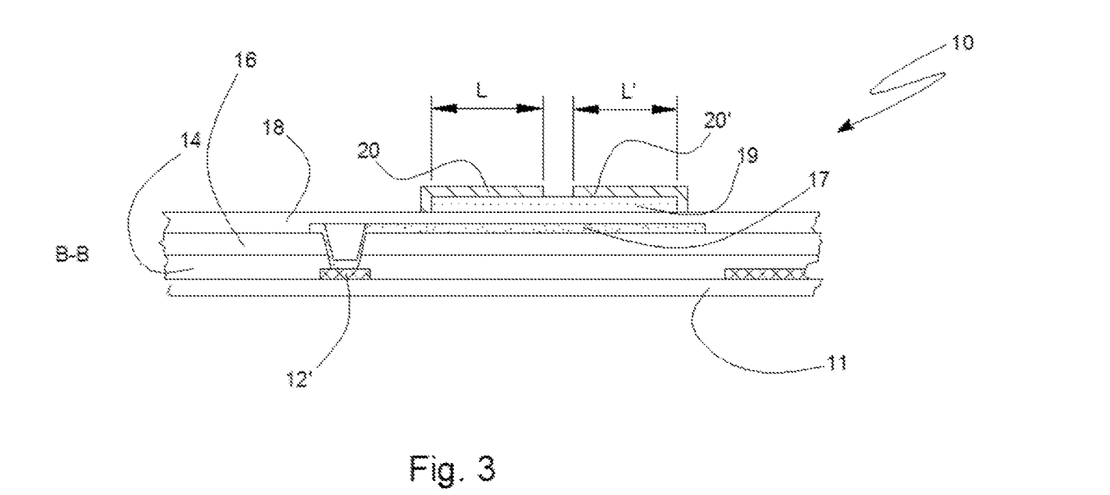
FIG. 3 is a cross section view of a display pixel according to another embodiment of the present invention along line B-B, wherein at least one of the second source electrode and the second drain electrode of the second light emitting transistor is on top of the light emitting channel layer and is in contact with the second dielectric layer.

A cross section along line B-B of a display pixel according to another embodiment of the present invention is shown in FIG. 3. According to this embodiment, the second source electrode and the second drain electrode 20 and 20' of the second (light emitting) transistor are formed over the light emitting channel layer 19 and are also in contact with the second dielectric layer 18; specifically, each of the second source electrode and the second drain electrode 20 and 20' extends beyond an edge of the light emitting channel layer 19 to make contact with the second dielectric layer 18.

Figure 4:
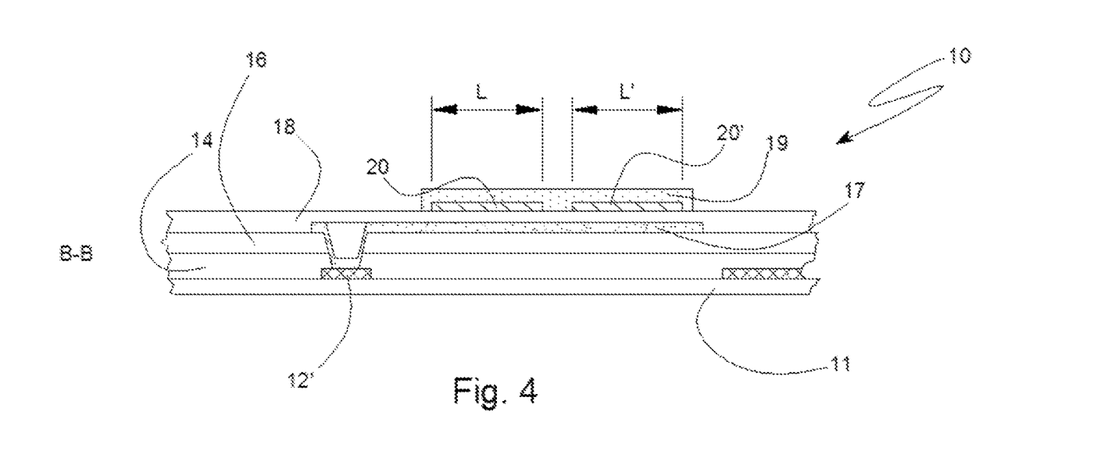
FIG. 4 is a cross section view of a display pixel according to yet another embodiment of the present invention along line B-B, in which both the second source electrode and the second drain electrode of the second light emitting transistor lie above the second dielectric layer and are positioned underneath the light emitting channel layer.

Another embodiment of a display pixel of the present invention is illustrated in FIG. 4, which shows its cross section along line B-B. According to this embodiment, the second source electrode and the second drain electrode 20 and 20' are deposited on the second dielectric layer 18 and are positioned at the bottom of the light emitting channel layer 19. For example, the second source electrode and the second drain electrode 20 and 20' can be at least partially encapsulated by the light emitting channel layer 19, which is also in contact with the second dielectric layer 18.

Figure 5:
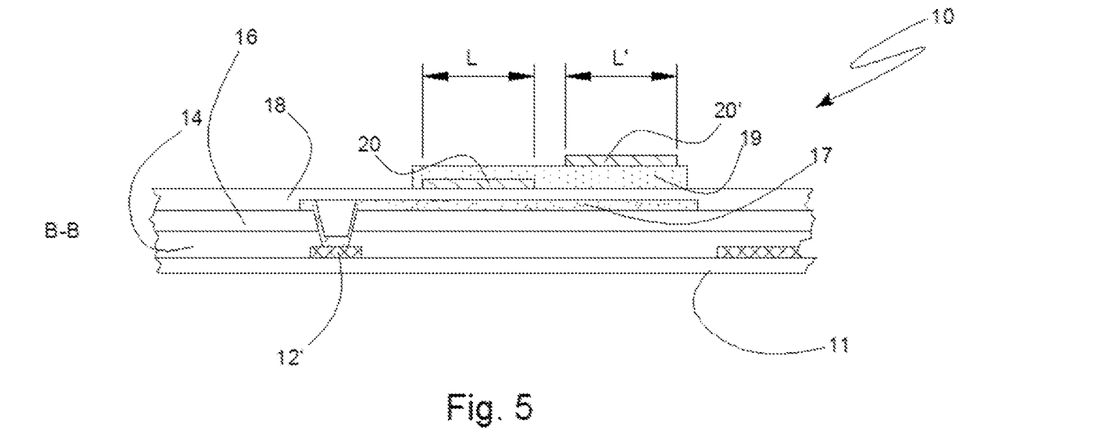
FIG. 5 is a cross section view of a display pixel according to yet another embodiment of the present invention along line B-B, in which one of the second source electrode and the second drain electrode of the second light emitting transistor is positioned within and the other is positioned on top of the light emitting channel layer.

According to another embodiment, the cross-sectional view of which is shown in FIG. 5, one of the second source electrode and the second drain electrode (e.g., the second source electrode 20) of the second light emitting transistor can be positioned at the bottom of the light emitting channel layer 19, and the other of the second source and second drain electrodes (e.g., the second drain electrode 20') can be positioned on top of the light emitting channel layer 19. In other words, according to this embodiment, the second source electrode and the second drain electrode 20 and 20' are both horizontally and vertically displaced from each other, with one of the electrodes that can be described to be within the light emitting channel layer 19.

Figure 6:
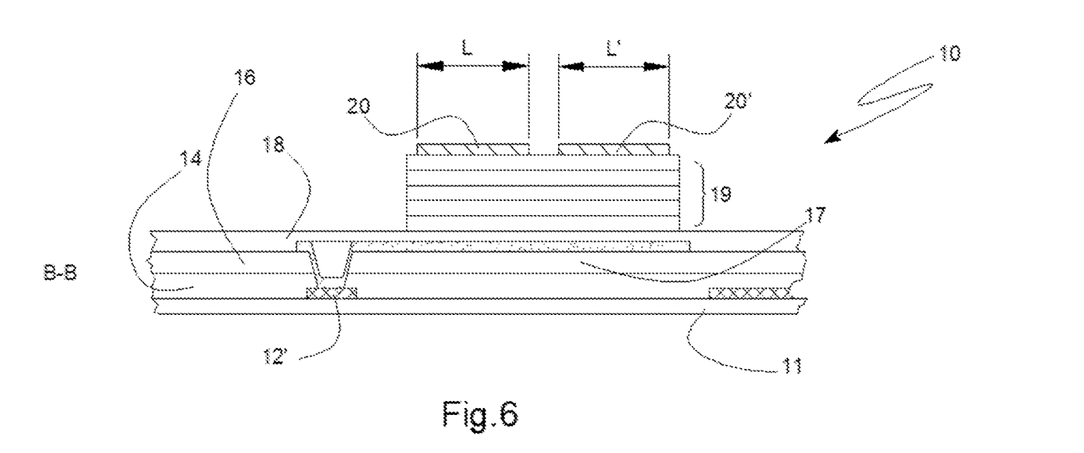
FIG. 6 is a cross section view of a display pixel according to yet another embodiment of the present invention along line B-B, in which the light emitting channel layer comprises a multi-layer stack of organic semiconductor layers (up to n layers of organic semiconductor layers).
Figure 7:
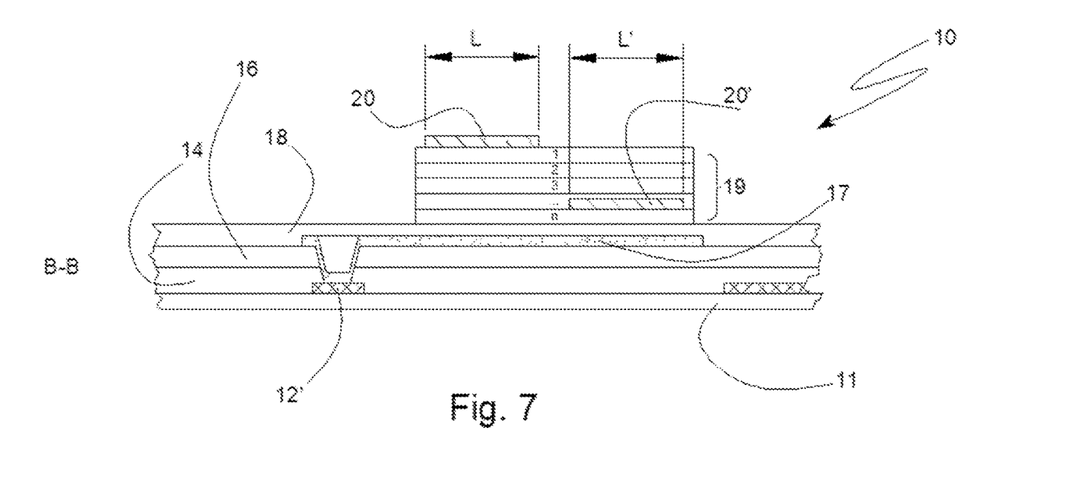
FIG. 7 is a cross section view of a display pixel according to yet another embodiment of the present invention along line B-B, in which one of the second source electrode and the second drain electrode of the second light emitting transistor is positioned on top of and the other is positioned within the multi-layer light emitting channel layer.

It is not necessary to realize the light emitting channel layer with a single layer of organic material. For example, the light emitting channel layer 19 may be composed of a stack of a plurality of layers, for example, from 2 to an integer number n layers, as shown in FIG. 6. In particular, the light emitting channel layer 19 may include one or more hole transport layers each comprising a p-type semiconductor, one or more emissive layers in which the recombination of electrons and holes can take place, and one or more electron transport layers each comprising an n-type semiconductor. The second source electrode and the second drain electrode 20 and 20' may be formed both above the topmost layer of the stack, as shown in FIG. 6, or one of them may be formed above the topmost layer and the other below the stack or buried within an intermediate layer of the stack, as illustrated in FIG. 7.

Figure 8:
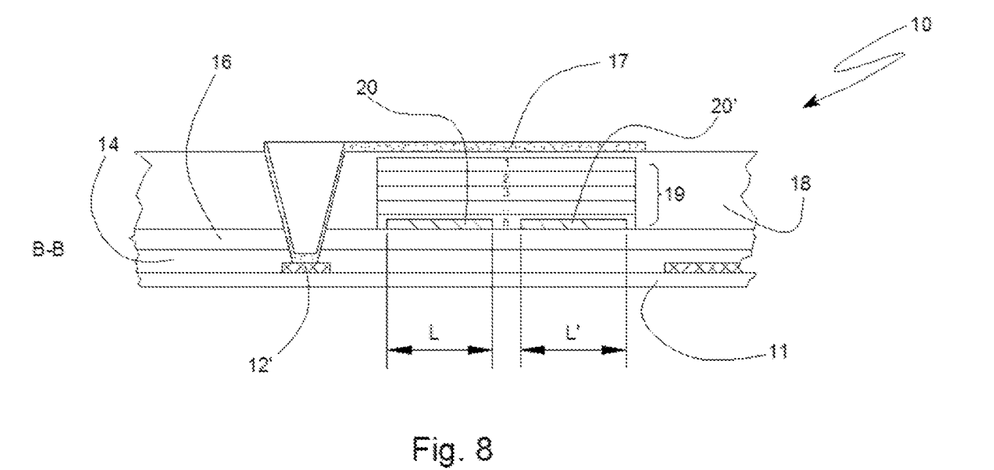
FIG. 8 is a cross section view of a display pixel according to yet another embodiment of the present invention along line B-B, in which the light emitting channel layer comprises a stack of a plurality n of organic semiconductor layers, the second dielectric layer is deposited over the light emitting channel layer, the second gate electrode is positioned on top of the second dielectric layer and the second source and second drain electrodes are positioned at the bottom of the light emitting channel layer.
Figure 9:
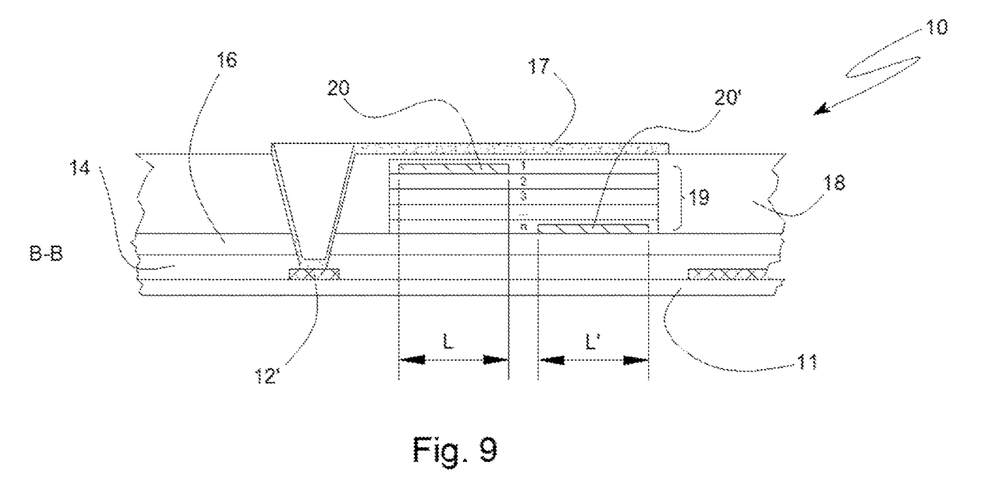
FIG. 9 is a cross section view of a display pixel according to yet another embodiment of the present invention along line B-B, in which the light emitting channel layer comprises a stack of a plurality n of organic semiconductor layers, the second dielectric layer is deposited over the light emitting channel layer, the second gate electrode is positioned on top of the second dielectric layer, the second source and second drain electrodes are in contact with different organic semiconductor layers within the light emitting channel layer (as illustrated, one of the second source and second drain electrodes is in contact with the first organic semiconductor layer while the other of the second source and second drain electrodes is in contact with the $n^{th}$ organic semiconductor layer).

The second (light emitting) transistor may also be realized as shown in FIGS. 8 and 9, that is, having a top-gate architecture, with the stack of n layers constituting the light emitting channel layer surmounted by the second dielectric layer 18 over which the second gate electrode 17 is realized. In the embodiment of FIG. 8, both the second source electrode and the second drain electrode 20 and 20' are positioned below the light emitting channel layer 19 (particularly, encapsulated by the bottommost layer n of the multi-layer organic light emitting channel layer 19). In the embodiment of FIG. 9, a second electrode (for example, the second source electrode 20) is positioned above the second topmost layer of the stack and is buried by the topmost layer of the light emitting channel, the other second electrode (for example, the second drain electrode 20') is realized on the insulating layer 16 and is positioned at the bottom of the stack.

Figure 10:
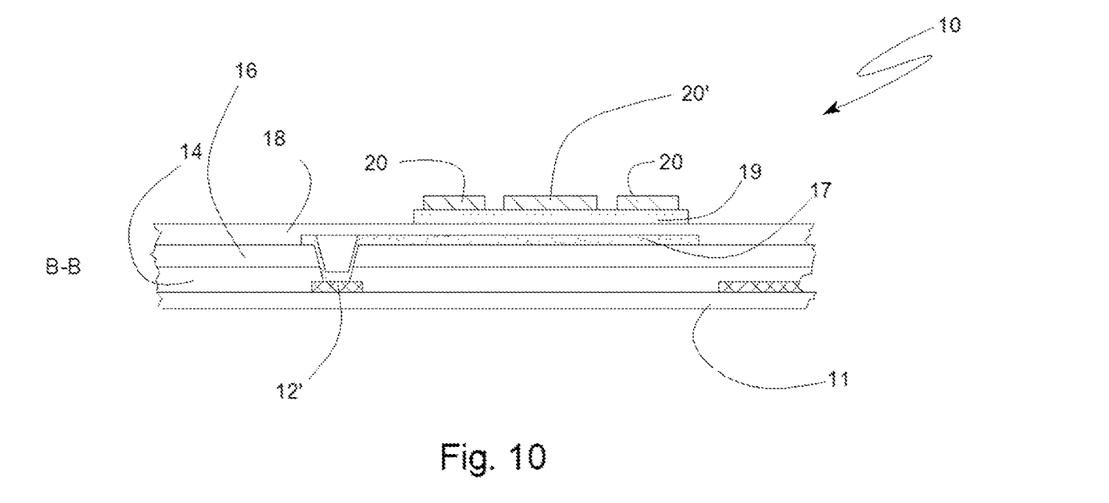
FIG. 10 is a cross section view of a display pixel according to yet another embodiment of the present invention along line B-B, in which the second light emitting transistor comprises more than two second source and drain electrodes alternately disposed on the light emitting channel layer (e.g., source/drain/source or drain/source/drain in the illustrated configuration).

The various second light emitting transistors illustrated in FIGS. 1 to 9 all have a single channel structure. FIG. 10 illustrates an alternative embodiment in which the second light emitting transistor has a multi-channel structure. Specifically, the second light emitting transistor has at least 3 second electrodes which are horizontally (i.e., orthogonal to the stacking direction of the layers that comprise the second transistor) alternated. For example, such embodiments can include a common second drain electrode positioned between two second source electrodes. Each of the second source electrodes is horizontally displaced from the common second drain electrode, thereby defining two channels. This embodiment can lead to advantages including much improved light emission under the common drain electrode, and higher light/dark ratio.

Figure 11:
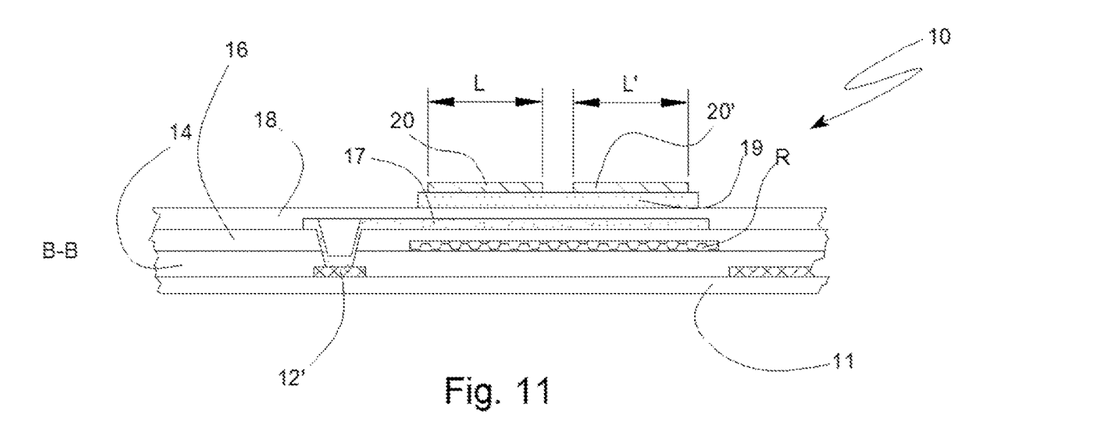
FIG. 11 is a cross section view of a display pixel according to yet another embodiment of the present invention along line B-B, in which the second light emitting transistor comprises a reflecting layer R positioned below the light emitting channel layer.
Figure 12:
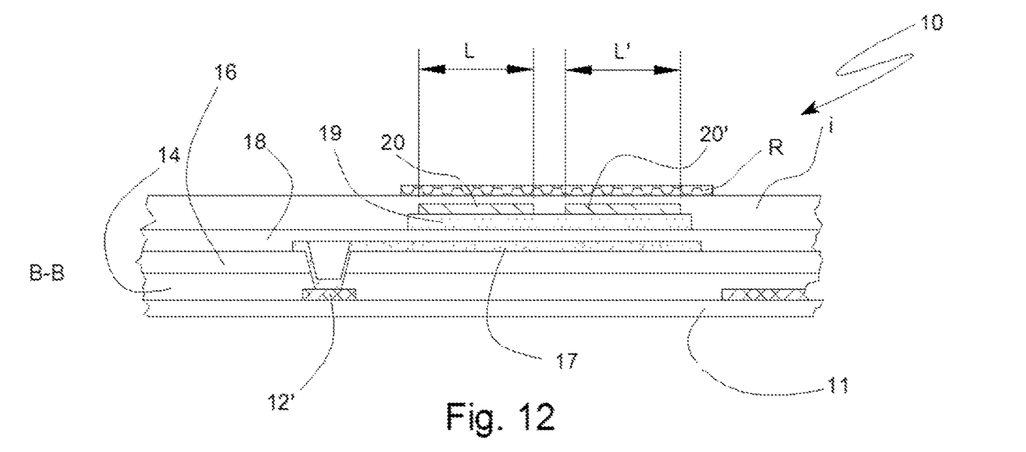
FIG. 12 is a cross section view of a display pixel according to yet another embodiment of the present invention along line B-B, in which the second light emitting transistor comprises an insulating layer "i" deposited over the light emitting channel layer and the second source and second drain electrodes, and a reflecting layer R positioned on top of the insulating layer "i".

As illustrated in the cross-sectional view along line B-B shown in FIGS. 11 and 12, the second transistor (i.e. the light emitting transistor) may be equipped with a reflecting layer R for reflecting upwards (FIG. 11) or downwards (FIG. 12) the light emitted by the light emitting channel layer 19. In the former case (FIG. 11) the reflecting layer R is realized in the insulating layer 16 below the second gate electrode 17; in the latter case (FIG. 12) the second source electrode and the second drain electrode 20 and 20' are encapsulated by an electrically insulating layer i above which the reflecting layer R is realized.

According to yet another embodiment, not shown in the figures, the second gate electrode 17 of the light emitting transistor can act as a reflecting layer for reflecting upward the light emitted by the light emitting channel layer 19. In a preferred embodiment, the second gate electrode is formed by a light-reflecting and electrically conducting material such as silver, aluminum, or another highly reflective metal.

Figure 13:
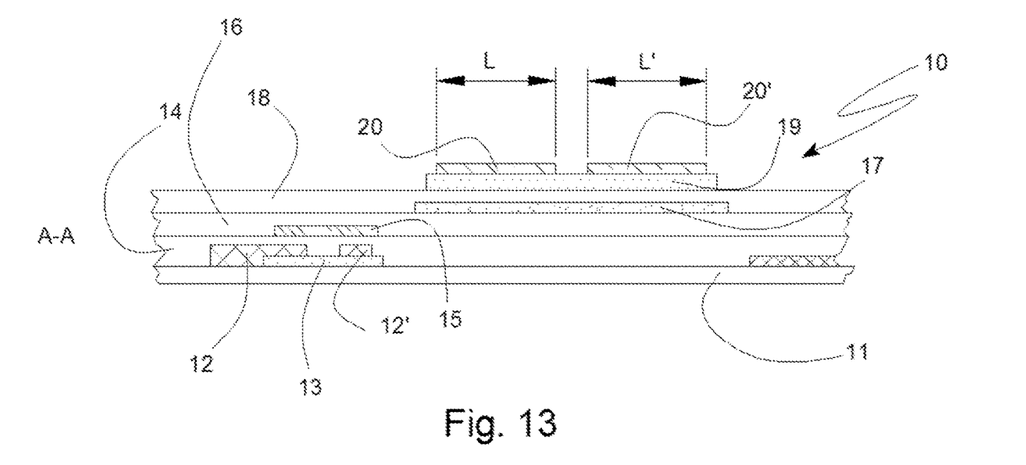
FIG. 13 is a cross section view of a display pixel according to yet another embodiment of the present invention along line A-A, wherein the first driving transistor is configured such that the first drain and first source electrodes are not completely coplanar with the semiconductor layer. In the configuration illustrated, one of the first drain and first source electrodes lies on the semiconductor layer while the other of the first drain and first source electrodes is in contact with both the semiconductor layer and the substrate.

In all embodiments so far presented of the display pixel of the present disclosure, reference was made only to the cross-section along line B-B assuming that the cross section along line A-A may be as in FIG. 2A. Nevertheless, the display pixel according to the shown embodiments may have a cross section along line A-A as depicted in FIG. 13, in which the first source electrode 12 is realized partially on the substrate 11 and partially on the semiconducting layer 13, over which the first drain electrode 12' is formed.

As an alternative not shown in the figures, both the first source electrode and the first drain electrode 12 and 12' can be realized either above or below the semiconductor layer 13.

According to yet another embodiment not shown in the figures, the first gate electrode 15 is realized on the substrate 11 and is located below the first dielectric layer 14 and the semiconductor layer 13.

Another embodiment according to the present invention envisions the use of different materials for the second source electrode versus the second drain electrode to facilitate charge injection. The two electrodes can be made entirely with a different material or one or both electrodes can incorporate a different material in addition to a common material present in both electrodes.

Figure 14:
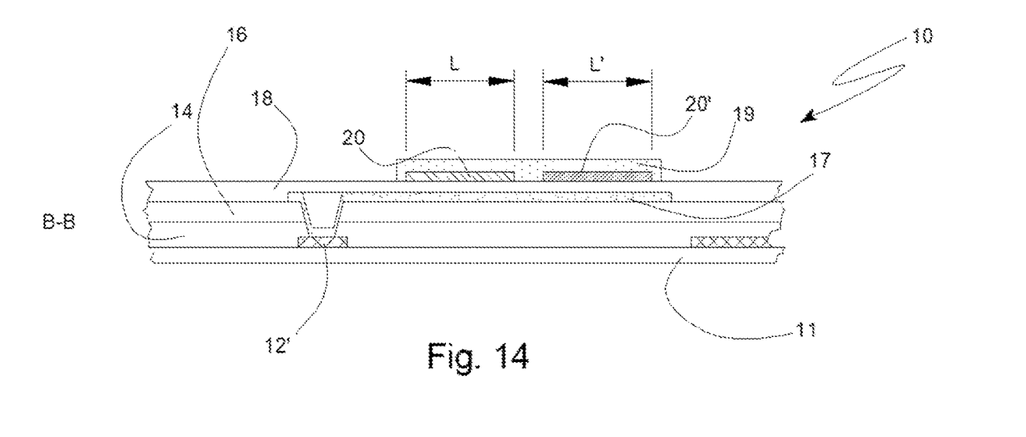
FIG. 14 is a cross section view along line B-B of a display pixel similar to the embodiment shown in FIG. 4, except the second source and second drain electrodes are depicted as being made with different materials.
Figure 15:
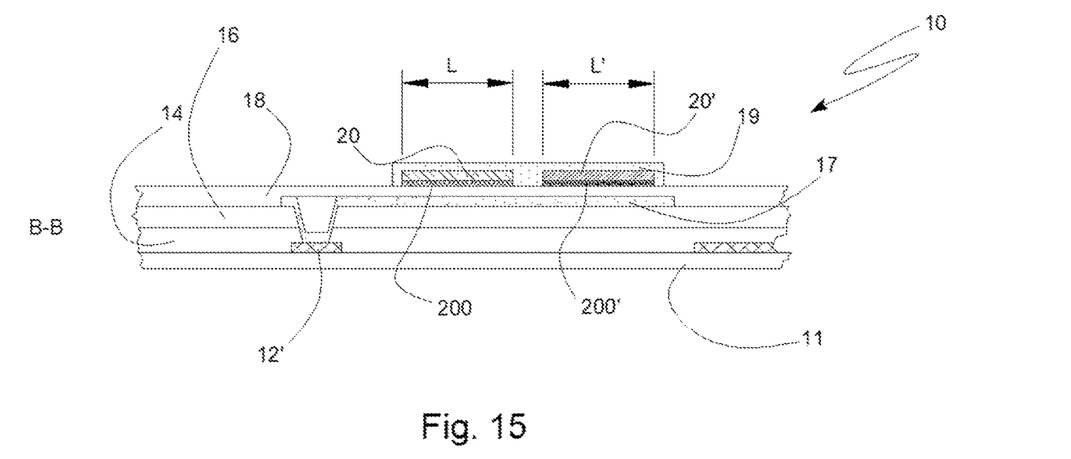
FIG. 15 is a cross section view along line B-B of a display pixel which is another possible variant of the embodiment shown in FIG. 4, in which an interlayer is inserted between the light emitting channel layer and each of the second source and second drain electrodes, where such interlayers can be made entirely of or can include a different material compared to the material from which the second source and second drain electrodes are made.

FIG. 14 shows an embodiment otherwise similar to that shown in FIG. 4, except the second source electrode is made of a different material than the second drain electrode. FIG. 15 shows another solution of such variants, always with the purpose of facilitating charge injection, in this case by means of interlayers 200, 200', respectively placed between the second source/drain electrodes and the second dielectric layer 18. As mentioned, FIGS. 14 and 15 illustrate possible variations to the embodiment shown in FIG. 4, but such solution can be adopted more generally in any of the embodiments according to the present invention.

The display pixel of the present invention may be realized on a same substrate with other identical display pixels disposed in rows and columns for forming an array of display pixels having a plurality of enable lines SCAN and address lines DATA. Conveniently, the display pixels of a same row will be connected to a same enable line SCAN and the display pixels of a same column will be connected to a same address line DATA, so as to singularly command each display pixel of the array by applying appropriate voltages at the respective enable line and address line. The drain and source electrodes of each light emitting transistor in each pixel will be connected to a same drain line and a same source line to provide the same voltage bias to all the pixels.

Conveniently SCAN and DATA lines can be used to control groups of three pixels, each emitting a different color, namely, red, green, and blue, in order to realize what is commonly called the RGB configuration.

Figure 16A:
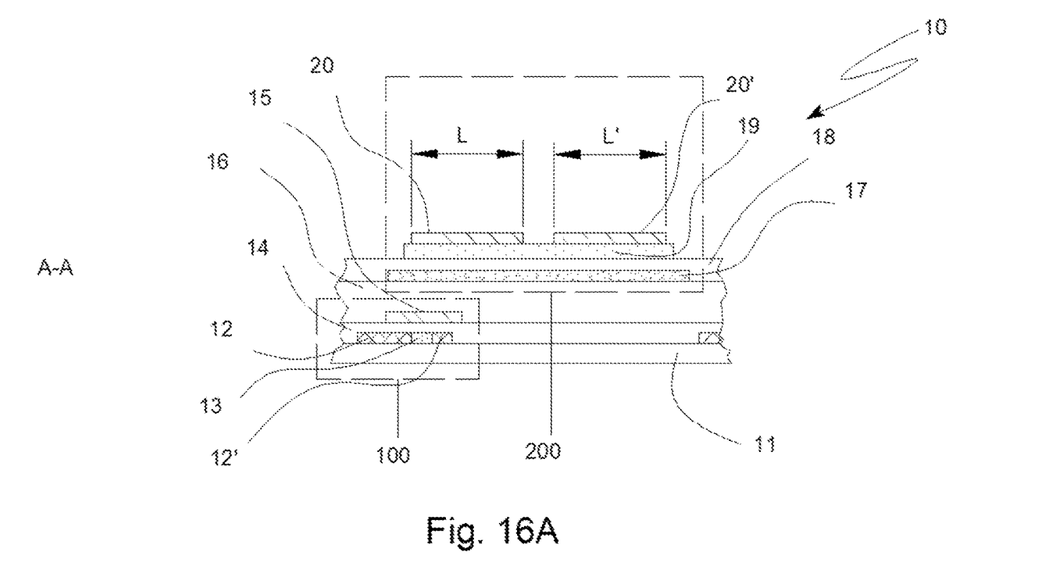
FIG. 16A is a cross section view of a display pixel according to another embodiment of the present invention along line A-A.
Figure 16B:
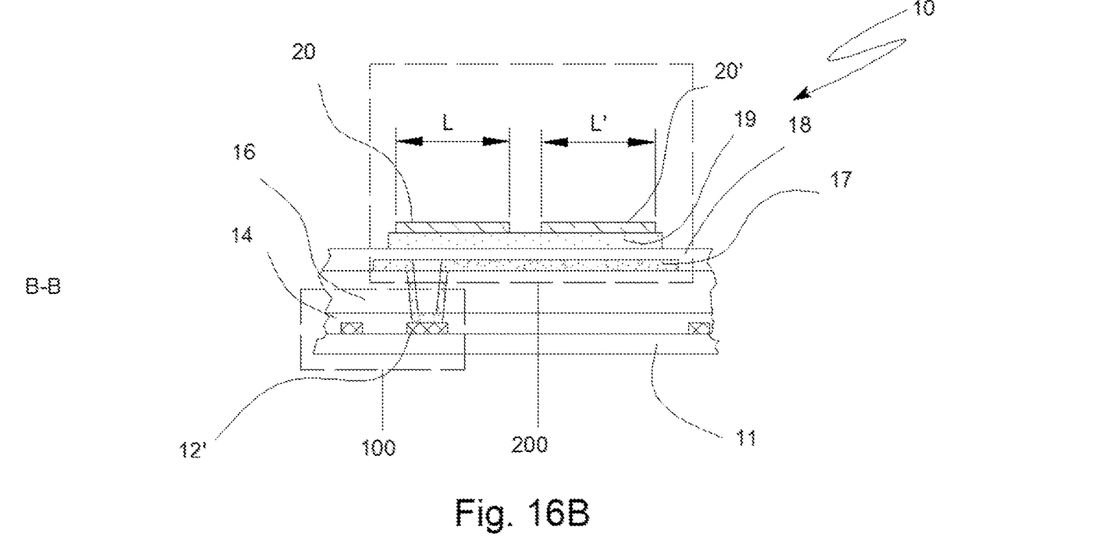
FIG. 16B is a cross section view of the embodiment illustrated in FIG. 16A but along line B-B.

FIGS. 16A and 16B show the cross section view along line A-A and the cross section view along line B-B, respectively, of another embodiment according to the present invention. In this case the driving transistor 100 is placed at least partly beneath the light emitting transistor 200. In the particular embodiment shown in FIGS. 16A and 16B, the first gate electrode 15, the first dielectric layer 14, the semiconductor layer 13 and a first transistor electrode 12'

(source or drain) are all positioned beneath one of the second light emitting transistor electrodes (e.g., the second source electrode 20).

This specific configuration, and more generally a configuration when there is at least a partial overlap between one of the source and drain electrodes of the second light emitting transistor and at least a part of the first driving transistor decreases the dark area of each pixel, thereby improving the aperture ratio of the pixel (defined as the ratio of the lit area over the whole pixel area) and in turn improving the overall brightness of the pixel and increasing the resolution of the display using such a pixel structure due to the smaller pixel dimension. In order to better exploit this effect, it is preferable that at least 10% of either the device width or the device length of the first driving transistor vertically overlaps (lies beneath) one of the second (source or drain) electrodes.

Figure 17:
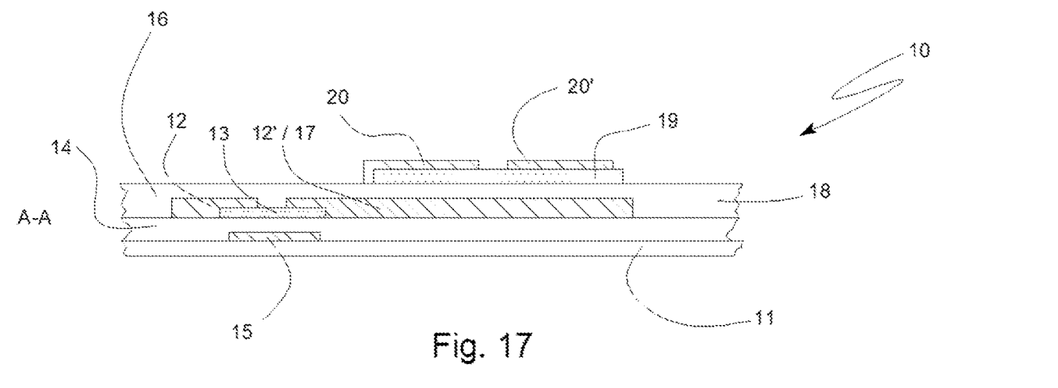
FIG. 17 is a cross section view along line A-A of a display pixel according to another embodiment of the present invention, where a common electrode is formed and employed as both the first drain electrode of the first transistor and the second gate electrode of the second transistor.
Figure 18:
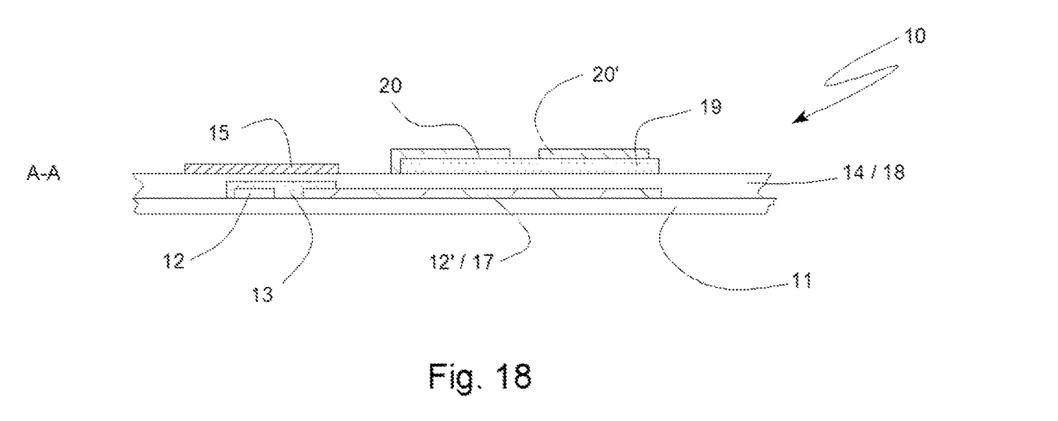
FIG. 18 is a cross section view along line A-A of a display pixel which is a variant of the embodiment shown in FIG. 17, having a structure that allows further simplification in the product process due to the use of a single common dielectric layer as both the first dielectric layer and the second dielectric layer.

FIG. 17 shows a cross section view along line A-A in which this concept is exploited to introduce a further simplification, i.e., instead of creating a via hole in the second gate electrode of the second light emitting transistor to make electrical contact with a first source/drain electrode of the first transistor, a common electrode is formed as both the first drain electrode 12' of the first driving transistor as well as the second gate electrode 17 of the second light emitting transistor, thus eliminating the need to create a via hole and simplifying the production process. In FIG. 17, a bottom-gate top-contact structure of the first driving transistor is shown as an example where driving this implies the use of two dielectric layers 14 and 18 for a pixel 10. FIG. 18 shows a top-gate bottom-contact structure of the first driving transistor that allows the first dielectric layer 14 to coincide with the second dielectric layer 18, thus further simplifying the production process and the number of materials used, and in turn the cost of the display.

All publications, patent applications, patents, and other references mentioned herein are incorporated by reference in their entirety. In case of conflict, the present specification, including definitions, controls.

The invention claimed is:

1. A display containing an array of pixels, wherein each pixel comprises at least a first driving transistor and at least a second light emitting transistor mounted on a common substrate adjacent the first driving transistor, wherein the first driving transistor is a lateral channel field effect transistor that comprises the following elements:
   a first source electrode and a first drain electrode physically separated but electrically connected to each other by a semiconductor layer,
   a first dielectric layer, and
   at least one first gate electrode, and
the second light emitting transistor is a lateral channel field effect transistor that comprises the following elements:
   a second gate electrode,
   a second dielectric layer,
   a light emitting channel layer, and
   a second source electrode having a length Ls and a second drain electrode having a length Ld,
wherein the second gate electrode is in electrical contact with the first source electrode and/or the first drain electrode, and
characterized in that at least one of the second source electrode and the second drain electrode vertically overlaps with the second gate by at least 5 μm, such vertical overlaps being represented by L and L', respectively, and that said second source electrode and second drain electrode are horizontally separated by at least 2 μm.

2. A display according to claim 1 wherein said vertical overlap(s) L and/or L' are between 5 μm and 150 μm.

3. A display according to claim 1 wherein said second source electrode and said second drain electrode are horizontally separated by a distance between 2 μm and 50 μm.

4. A display according to claim 1 wherein each of said second source electrode and said second drain electrode vertically overlaps with said second gate electrode by at least 5 μm.

5. A display according to claim 1 wherein the entire length Ls of said second source electrode and the entire length Ld of second drain electrode vertically overlap with said second gate electrode, wherein said second gate electrode has a length that is greater than the sum of Ls, Ld, and the horizontal separation between said second source electrode and said second drain electrode.

6. A display according to claim 1 wherein the length of the second source electrode (Ls) and the length of the second drain electrode (Ld) are chosen in accordance to the following formula:

$$1 \leq \text{Maximum}(Ld, Ls)/\text{Minimum}(Ld, Ls) \leq 25.$$

7. A display according to claim 1 wherein at least one of said second source electrode and said second drain electrode is in contact with both the light emitting channel layer and the second dielectric layer.

8. A display according to claim 1 wherein the light emitting channel layer is ambipolar.

9. A display according to claim 1 wherein said second light emitting transistor comprises a third source or drain electrode disposed in such a way that source and drain electrodes alternate horizontally.

10. A display according to claim 1 comprising a reflecting layer above or below the light emitting channel layer.

11. A display according to claim 1 wherein said first source electrode and said first drain electrode are positioned both above or both below the semiconductor layer.

12. A display according to claim 1 wherein the first gate electrode is positioned below the semiconductor layer.

13. A display according to claim 1 wherein the first gate electrode is positioned above the semiconductor layer.

14. A display according to claim 1 wherein the second source and second drain electrodes comprise at least one different material which is not comprised in the other of said second source and second drain electrodes.

15. A display according to claim 14 wherein said at least one different material is in the form of an interposed layer deposit or an interposed layer component, said interposed layer being placed between the at least one of said second source and second drain electrodes and the light emitting channel layer.

16. A display according to claim 1 wherein at least one of the first source and first drain electrodes of the first driving transistor is at least partially beneath one of the second source and second drain electrodes.

17. A display according to claim 16 wherein at least 10% of the area of the first driving transistor is beneath one of the second source and second drain electrodes of the second light emitting transistor.

18. A display according to claim 1 wherein one of the first source and first drain electrodes of the first driving transistor is adapted to function also as the second gate electrode of the second light emitting transistor.

19. A display according to claim 18 wherein the first dielectric layer of the first driving transistor is adapted to function also as the second dielectric layer of the second light emitting transistor.

20. A display according to claim 1 wherein
said vertical overlap(s) L and/or L' are between 5 μm and 150 μm;
said second source electrode and said second drain electrode are horizontally separated by a distance between 2 μm and 50 μm; and
the entire length Ls of said second source electrode and the entire length Ld of second drain electrode vertically overlap with said second gate electrode, wherein said second gate electrode has a length that is greater than the sum of Ls, Ld, and the horizontal separation between said second source electrode and said second drain electrode.

21. A display according to claim 1 wherein Ls and Ld satisfy the following formula:

$1 \leq \mathrm{Maximum}(Ld,Ls)/\mathrm{Minimum}(Ld,Ls) \leq 25.$

* * * * *